(12) United States Patent
Wang

(10) Patent No.: US 11,411,534 B2
(45) Date of Patent: Aug. 9, 2022

(54) HYBRID SOLAR THERMAL AND PHOTOVOLTAIC PANEL AND HEAT PUMP AND NON-TRACKING NON-IMAGING SOLAR CONCENTRATOR BASED CSP STABILIZED POWER GENERATION SYSTEM

(71) Applicant: Yonghua Wang, Klamath Falls, OR (US)

(72) Inventor: Yonghua Wang, Klamath Falls, OR (US)

( * ) Notice: Subject to any disclaimer, the term of this patent is extended or adjusted under 35 U.S.C. 154(b) by 63 days.

(21) Appl. No.: 16/873,952

(22) Filed: Aug. 24, 2020

(65) Prior Publication Data
US 2022/0060148 A1 Feb. 24, 2022

(51) Int. Cl.
| | |
|---|---|
| *H02S 10/30* | (2014.01) |
| *H02S 40/44* | (2014.01) |
| *F24S 20/40* | (2018.01) |
| *F24S 23/30* | (2018.01) |
| *H02S 40/38* | (2014.01) |
| *F24S 20/00* | (2018.01) |
| *H02S 40/40* | (2014.01) |
| *H02S 40/42* | (2014.01) |

(52) U.S. Cl.
CPC .............. *H02S 40/44* (2014.12); *F24S 20/40* (2018.05); *F24S 23/31* (2018.05); *H02S 10/30* (2014.12); *H02S 40/38* (2014.12); *F24S 2020/18* (2018.05); *H02S 40/40* (2014.12); *H02S 40/42* (2014.12)

(58) Field of Classification Search
CPC ....... H01L 31/00–078; Y02E 10/50–60; H02S 10/10; H02S 10/30; H02S 40/20–22; H02S 40/30; H02S 40/38; H02S 40/40–44

USPC .................................................. 136/243–265
See application file for complete search history.

(56) References Cited

U.S. PATENT DOCUMENTS

| | | | | |
|---|---|---|---|---|
| 6,111,190 A | * | 8/2000 | O'Neill | F24S 23/31 359/742 |
| 2011/0272003 A1 | * | 11/2011 | Elazari | H02S 40/44 60/645 |

FOREIGN PATENT DOCUMENTS

| | | | |
|---|---|---|---|
| CN | 204027080 | * | 12/2014 |
| CN | 107579535 | * | 1/2018 |

OTHER PUBLICATIONS

CN 107579535 English translation (Year: 2018).*
CN204027080 English translation (Year: 2014).*

* cited by examiner

*Primary Examiner* — Bach T Dinh

(57) ABSTRACT

A hybrid solar thermal and photovoltaic panel based cogeneration system and heat pump and non-tracking non-imaging solar concentrator based CSP stabilized power generation system comprises a hybrid solar thermal and photovoltaic panel based cogeneration subsystem to cogenerate electricity and heat, a heat pump subsystem to raise the temperature of the cogenerated heat, a non-tracking non-imaging solar concentrator based CSP subsystem to further upgrade the cogenerated thermal energy, a thermal storage to store the cogenerated heat, and a thermal power regeneration system, to take the stored cogenerated heat to regenerate power. The power output of the cogeneration subsystem supplemented with the power output from the thermal power regeneration system realizes stabilized power output.

4 Claims, 5 Drawing Sheets

HYBRID SOLAR THERMAL AND PHOTOVOLTAIC PANEL AND HEAT PUMP AND NON-TRACKING NON-IMAGING SOLAR CONCENTRATOR BASED CSP STABILIZED POWER GENERATION SYSTEM

TECHNICAL FIELD

The present disclosure relates generally to solar power generation, more specifically to a hybrid solar thermal and photovoltaic panel based cogeneration system coupled with a heat pump system, and a non-tracking non-imaging solar concentrator based Concentrating Solar Power (CSP) system with a thermal storage system, to realize stabilized power generation.

BACKGROUND

Contrast to the internal combustion engine vehicle, which consumes fossil fuel with high energy density, and without need to replenish energy frequently, the electric vehicle powered with battery with energy density 100-200 times lower than that of fossil fuel needs frequent energy replenishment. It means that electric vehicles need a distributed energy replenishment infrastructure system to support the wide-spread adoption of them. Solar energy is a distributed energy resource in its nature and naturally fits in the demand of electric vehicles. Therefore, solar powered electric vehicle charging station is a perfect match to the energy demand of electric vehicle. However, solar powered electric vehicle charging stations are impeded by the intermittence of the current solar technology and the cost of the current battery technology. Most of current solar systems rely on power grid to balance the intermittence, however, it is almost impossible to construct the transmission lines along highways for covering the entire road system using power grid. Therefore, research and development of stabilized solar power generation station becomes the key in addressing the fundamental issue of electric vehicle charging.

The conventional flat plate photovoltaic panel used to construct the conventional solar powered electric vehicle charging station, has low conversion efficiency and the waste heat generated in the photovoltaic conversion process is detrimental to the photovoltaic conversion performance due to the raised temperature. The photovoltaic performance of the conventional flat plate panels will degrade in hot weather environment, especially in tropic areas.

The conventional battery storage used in the conventional independent solar power generation station takes the photovoltaic generated electricity to store the energy rather than the waste heat to store the energy.

The heat extracted from the conventional flat plate photovoltaic panel has low temperature relative to thermal power generation and is not deployed.

Although CSP has great potential to raise the temperature of the waste heat from the conventional flat plate photovoltaic panels and regenerate electricity, there are no any CSP systems have ever been integrated with hybrid solar thermal and photovoltaic panel based cogeneration systems to regenerate power from the cogenerated thermal energy, and in conjunction with thermal storage, to realize stabilized power generation.

The goal of this invention is to provide a design paradigm of a combined hybrid solar thermal and photovoltaic panel based cogeneration system and a non-tracking non-imaging solar concentrator based CSP system, in conjunction with heat pump system and thermal storage system, to realize stabilized power generation.

The system of the present invention is configured in such a way that the hybrid solar thermal and photovoltaic panel based cogeneration subsystem is connected to a heat pump subsystem thermally and a battery storage subsystem electrically, and the heat pump subsystem is connected to a thermal storage subsystem, then the thermal storage subsystem is connected to a non-tracking non-imaging solar concentrator based CSP subsystem, and finally a thermal power regeneration subsystem is connected to the thermal storage system. The cogenerated thermal energy from the hybrid solar thermal and photovoltaic cogeneration subsystem is extracted and heated up by the heat pump subsystem to upgrade its quality, and then transferred to the thermal storage subsystem. The stored cogenerated thermal energy in the thermal storage subsystem is further heated up with the non-tracking non-imaging solar concentrator based CSP subsystem for regenerating power. The cogenerated photovoltaic power and the CSP regenerated power supplement each other to realize the stabilized power generation.

OBJECTS AND ADVANTAGES

In the present invention, the hybrid solar thermal and photovoltaic panels are deployed to construct the cogeneration system, which can not only cogenerate electric energy and thermal energy and dramatically raise the total conversion efficiency to over 70%, but also improve the photovoltaic performance of the panel by cooling the photovoltaic cells through extracting the cogenerated heat which is wasted in the conventional photovoltaic panels. The extracted heat from the hybrid solar thermal and photovoltaic panels is further upgraded through the heat pump subsystem which transfers the heat from the hybrid panels to the thermal storage subsystem and raise up the temperature of the heat during the process. The electric power needed to power the heat pump subsystem maybe provided by the hybrid solar thermal and photovoltaic subsystem. The temperature of the stored cogenerated thermal energy in the thermal storage subsystem can be further boosted up by deploying the non-tracking non-imaging solar concentrators to improve the conversion efficiency of the CSP subsystem. The non-tracking non-imaging solar concentrator based CSP subsystem, in conjunction with the thermal storage subsystem and heat pump subsystem, serves as electric power regeneration system to supplement the photovoltaic power cogeneration of the hybrid solar thermal and photovoltaic subsystem to realize stabilized power generation. The entire system including the hybrid solar thermal and photovoltaic panel based cogeneration subsystem and the non-tracking non-imaging CSP subsystem is stationary without moving parts, and therefore is reliable. The entire system is operating at high efficiency due to the interaction between the photovoltaic generation and CSP regeneration. The key role played by the non-tracking and non-imaging solar concentrator lies in the boosting of temperature of the stored thermal energy at medium and high level so as to dramatically raise up the CSP conversion efficiency. In the operating of the entire system, the normally wasted thermal energy is deployed to balance the intermittence and realize the utility scale energy storage. Relative to the normal battery storage which stores the photovoltaic generated electricity, the active power regeneration type thermal energy storage is much cheaper than the battery storage in utility scale.

SUMMARY

The hybrid solar thermal and photovoltaic panel based cogeneration system and heat pump and non-tracking non-imaging solar concentrator based CSP stabilized power generation system comprises: (1) a hybrid solar thermal and photovoltaic panel based cogeneration subsystem; (2) a heat pump subsystem; (3) a thermal storage subsystem; (4) and a non-tracking non-imaging solar concentrator based CSP subsystem. Wherein, the hybrid solar thermal and photovoltaic panels are fabricated with solar cells on heat exchangers, when sunlight incidents on the hybrid solar thermal and photovoltaic panels, portion of sunlight is converted into electricity by the photovoltaic cells and the rest is converted into heat which is extracted by the heat exchangers. The photovoltaic part of the hybrid solar thermal and photovoltaic panels directly supply power to users and the heat pump subsystem, as well as charge the battery storage subsystem, and the thermal part of the hybrid solar thermal and photovoltaic panels is connected to the heat pump. The heat pump subsystem transfers the cogenerated heat from the hybrid solar thermal and photovoltaic panels to the thermal storage subsystem, and raises the temperature of the cogenerated heat up during the process. The thermal storage subsystem comprises a coil inside of it, and it is connected to the thermal receiver of the non-tracking non-imaging solar concentrators to further boost the temperature of the stored cogenerated heat. The coil is then connected to the thermal engine as the boiler, and then the thermal engine is connected to the condenser and back to the hybrid solar thermal and photovoltaic panel based cogeneration subsystem.

In summary, the present invention intends to provide 7 incentives to the solar power generation system: (1) high efficiency, the hybrid solar thermal and photovoltaic panel cogenerates electricity and heat and obtains the total conversion efficiency over 70%; the extraction of heat from the back side of photovoltaic panel of the hybrid solar thermal and photovoltaic panel significantly improve the efficiency of photovoltaic conversion; the non-tracking non-imaging solar concentrators improve efficiency of the thermal power generation subsystem by raising the temperature of the input heat resource; (2) low cost, the high total efficiency of the hybrid solar thermal and photovoltaic panels dramatically reduce the overall cost of the entire system; the non-tracking non-imaging concentrator substantially reduce the cost of CSP subsystem; (3) high reliability, the entire system eliminates moving parts and effectively increase the reliability; (4) thermal storage, the presented system use thermal energy to realize stabilized power generation; (5) stabilized power generation, the interaction of the photovoltaic power generation and the CSP smooth the intermittence of the solar energy resource; (6) multiple effect energy upgrading, the introduction of the heat pump subsystem not only cools down the hybrid solar thermal and photovoltaic panel, but also upgrades the cogenerated heat by using the photovoltaic generated power; (7) heat supply, it is obvious that if needed, the present system is able to supply heat directly.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate an embodiment of the invention and together with the description, serve to explain the principles of the invention.

DETAILED DESCRIPTION

Reference will now be made in detail to the present exemplary embodiment, example of which is illustrated in the accompanying drawings. Wherever possible, the same reference numbers will be used throughout the drawings to refer to the same or like parts.

Figure 1:
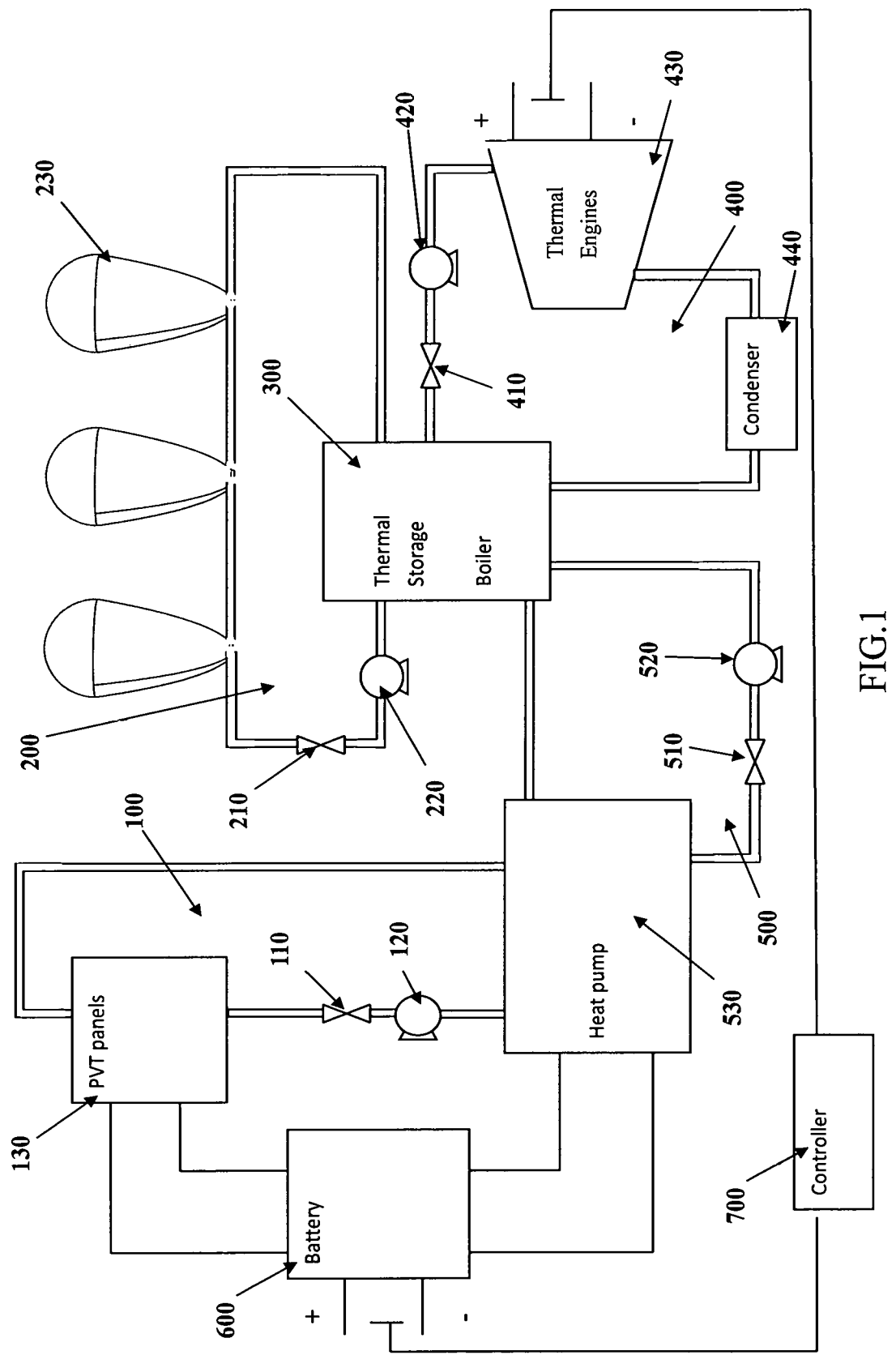
FIG. 1 diagrammatically illustrates the hybrid solar thermal and photovoltaic panel based cogeneration system and heat pump system and non-tracking non-imaging solar concentrator based CSP system stabilized power generation system.

Referring to FIG. 1, the hybrid solar thermal and photovoltaic panel based cogeneration system and heat pump system and non-tracking non-imaging solar concentrator based CSP system stabilized power generation system comprises: (1) the hybrid solar thermal and photovoltaic panel based cogeneration subsystem 100, which further comprises the hybrid solar thermal and photovoltaic panel array 130, pump 120, and valve 110; (2) the non-tracking non-imaging solar concentrator based CSP subsystem, which further comprises the non-tracking non-imaging solar concentrators 230, pump 220 and valve 210; (3) the thermal storage subsystem 300, which serves as both thermal storage and boiler; (4) the thermal power regeneration subsystem 400, which further comprises the valve 410, pump 420, thermal engines 430, which can be steam engine, sterling engine, Organic Rankin Cycle (ORC) engine, or combination of thereof, condenser 440; (5) the heat pump subsystem 500, which comprises the valve 510, pump 520, and heat pump 530; (6) the battery subsystem 600; (7) control subsystem 700. Wherein, the photovoltaic part of the subsystem 100 is connected to the subsystem 600 through electric cable and controller; the subsystem 600 is connected to the subsystem 500 through electric cable and controller; the thermal part of the subsystem 100 is connected to the subsystem 500 through valve 110 and pump 120; the subsystem 500 is connected to the subsystem 300 through the valve 510 and pump 520; the subsystem 200 is connected to the subsystem 300 through the valve 210 and pump 220; the subsystem 400 is connected to the subsystem 300 through the valve 410, pump 420. Wherein, the hybrid solar thermal and photovoltaic panel based cogeneration subsystem 100 generates electricity, which is conducted to the battery subsystem 600 for storage, and thermal energy, which is transferred to the heat pump subsystem 500 to raise temperature. The heat cogenerated by the subsystem 100 and upgraded by the subsystem 500 is transferred to the thermal storage subsystem 300 for storage. The stored thermal energy in subsystem 300 is further upgraded by the non-tracking non-imaging solar concentrator based CSP subsystem 200. Then the stored thermal energy in the subsystem 300 is extracted by the thermal regeneration subsystem 400 to regenerate electricity. Wherein, the subsystem 100 cogenerated electricity can be directly supply to outside and supplemented by the power regeneration subsystem 400 to realize the stabilized power generation with the coordination from the control subsystem 700; the control subsystem 700 connects to the battery subsystem 600 and the CSP subsystem 400.

Figure 2:
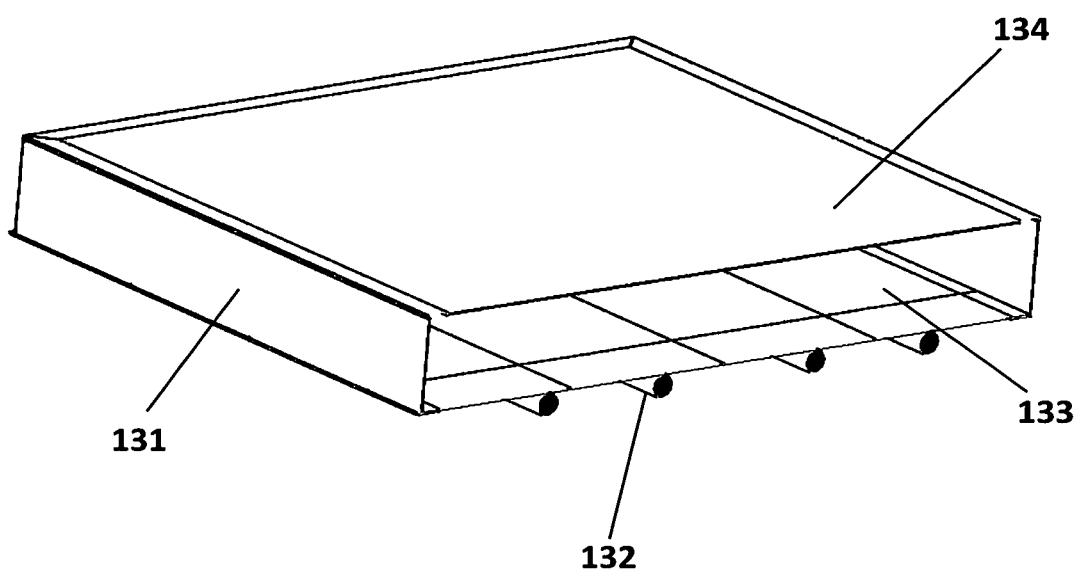
FIG. 2 is the cross section view of the hybrid solar thermal and photovoltaic panel used to construct the thermal energy and electricity cogeneration subsystem. Wherein, the photovoltaic cells are laminated on the fin-pipe plate coated with a heat-conductive and insulation coating to form the core part of the panel.

Referring to FIG. 2, the core part of the hybrid solar thermal and photovoltaic panel is formed by laminating the photovoltaic cells 133 onto the metal plate with the circulation pipes 132. When in operation, the sunlight penetrates through the transparent cover 134 and reaches to the photovoltaic cells, where it is absorbed and converted into electricity and heat. Where the 131 is the frame work of the panel. The electricity will be stored in the battery storage 600, and the heat will be extracted out by fluid circulation and transferred to the subsystem 500.

Figure 3:
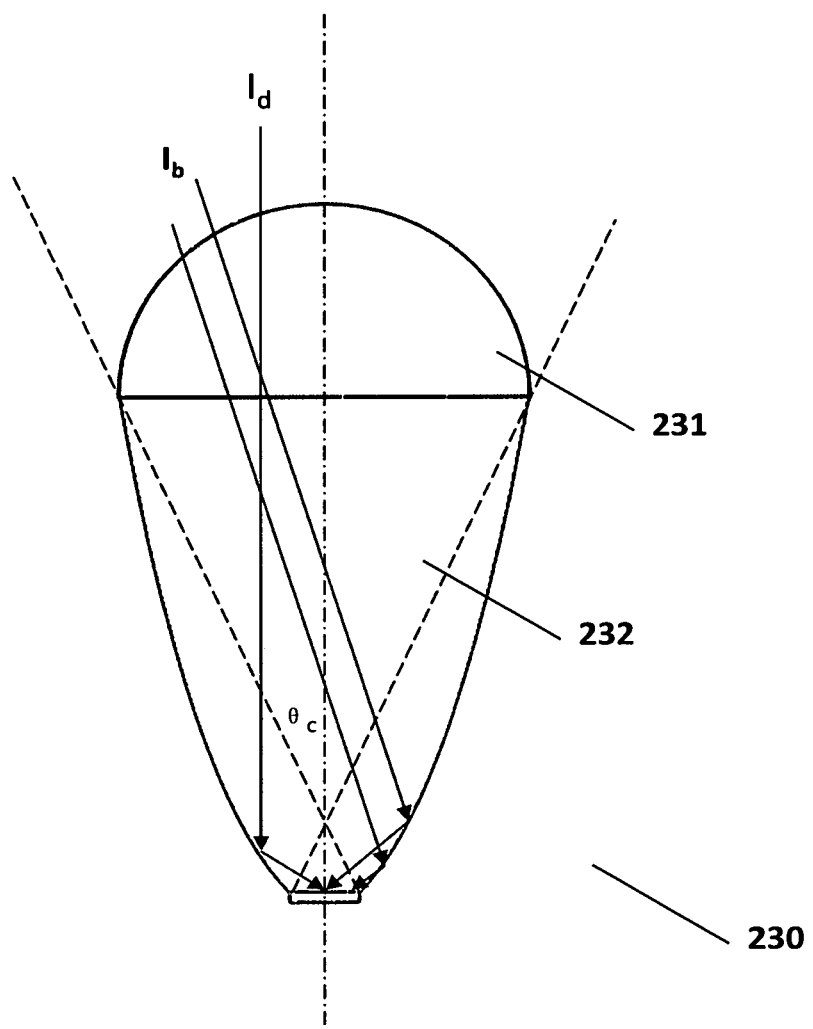
FIG. 3 is the illustration of the work principle of the non-imaging solar concentrator. The incident light no matter the diffuse light $I_d$ or the beam light $I_b$, as long as their incident angles fall in the half-acceptance angle $\theta_C$, will be concentrated onto receiver at the bottom of the non-imaging solar concentrator.

Referring to FIG. 3, the non-tracking non-imaging solar concentrator 230 is firstly formed by combining a top transparent dome 231 and a bottom reflective Compound Parabolic Concentrator (CPC) 232 together, and the central lines of the 2 parabola used to construct the CPC form the half-acceptance angles $\theta_C$ with the central line of the non-tracking non-imaging solar concentrator. The incident beam light $I_b$ and diffuse light $I_d$ form the incident angles with the central line of the non-tracking non-imaging solar concentrator 230. As long as the incident angles are smaller than the $\theta_C$, all incident lights no matter beam light or diffuse light will be concentrated to the bottom receiver.

Figure 4:
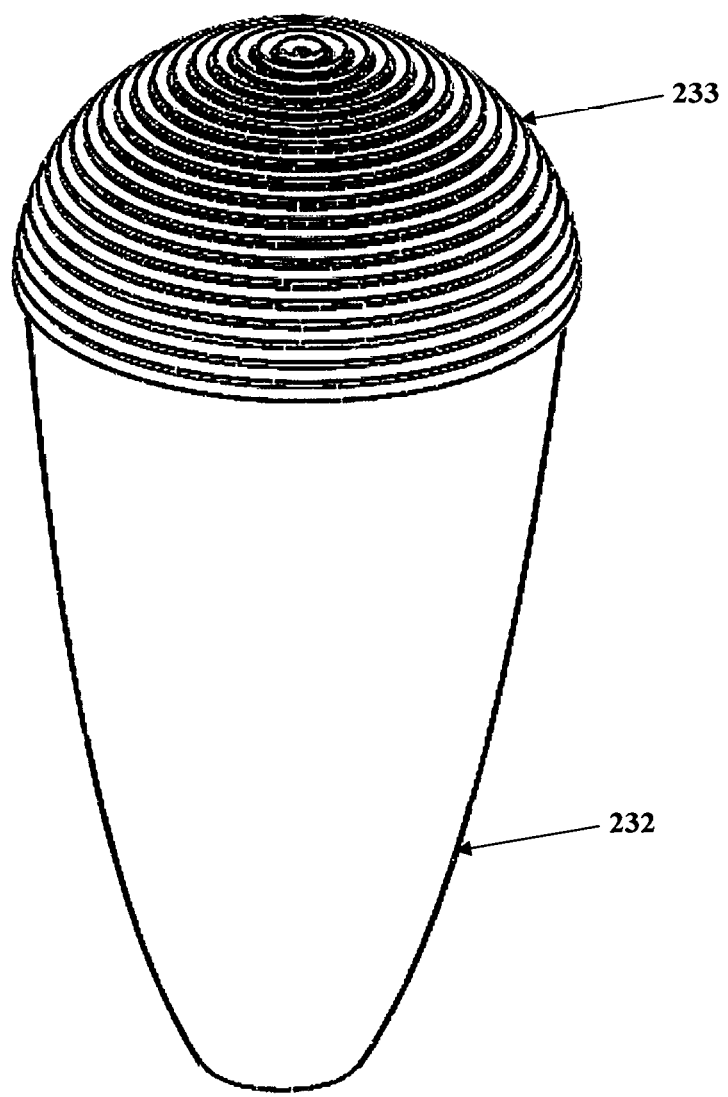
FIG. 4 is the configuration of the non-tracking non-imaging solar concentrator, wherein the non-tracking non-imaging solar concentrator is a combination of Compound Parabolic Concentrator and a domed divergent Fresnel Lens cover.

Referring to FIG. 4, in order to realize non-tracking, a domed divergent Fresnel Lens 233 is added on the top of the domed transparent cover 231 to enlarge the acceptance-half angle $\theta_C$ of CPC 232.

Figure 5:
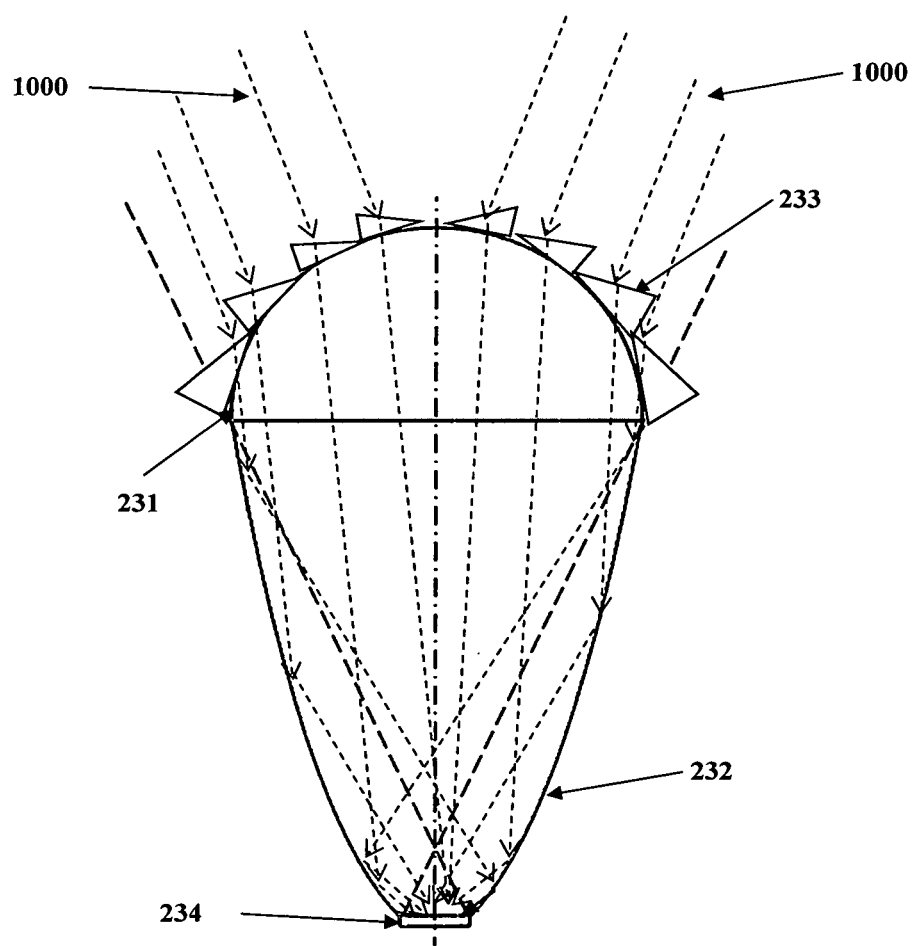
FIG. 5 illustrates the work principle of the non-tracking non-imaging solar concentrator, wherein the domed divergent Fresnel Lens cover enlarges the acceptance-half angle of the CPC.

Referring to the FIG. 5, the work principle of the non-tracking non-imaging solar concentrator 230 is illustrated, wherein the obliquely incident sunlight 1000 is refracted by the domed divergent Fresnel Lens 233 to force it falling in the acceptance-half angle $\theta_C$ of CPC 232 and concentrate it to the receiver 234.

In the preceding specification, various preferred embodiments have been described with reference to the accompanying drawings. It will, however, be evident that various other modifications and changes may be made thereto, and additional embodiments may be implemented, without departing from the broader scope of the invention as set forth in the claims that follow. The specification and drawings are accordingly to be regarded in an illustrative rather than restrictive sense.

Other embodiments of the invention will be apparent to those skilled in the art from consideration of the specification and practice of the invention disclosed herein. It is intended that the specification and examples be considered as exemplary only, with the true scope and spirit of the invention being indicated by the following claims.

I claim:

1. A hybrid solar thermal and photovoltaic panel based cogeneration subsystem and heat pump and non-tracking non-imaging solar concentrator based CSP stabilized power generation system comprising:
   a. a hybrid solar thermal and photovoltaic panel based cogeneration, which further comprises the hybrid solar thermal and photovoltaic panel array, pumps and valves;
   b. a non-tracking non-imaging solar concentrator based CSP subsystem, which further comprises the non-tracking non-imaging solar concentrators, pumps and valves;
   c. a thermal storage subsystem, which serves as both thermal storage and boiler;
   d. a thermal power regeneration subsystem, which further comprises a valve, pump, thermal engines, which can be steam engine, sterling engine, Organic Rankin Cycle (ORC) engine, or combination of thereof, condenser;
   e. a heat pump subsystem, which comprises a valve, a pump, and a heat pump;
   f. a battery subsystem;
   g. a control subsystem;
   wherein, the photovoltaic part of the cogeneration subsystem is connected to the battery subsystem through electric cable and controller; the battery subsystem is connected to the heat pump subsystem through electric cable and controller; the thermal part of the cogeneration subsystem is connected to the heat pump subsystem through valve and pump; the heat pump subsystem is connected to the thermal storage subsystem through the valve and pump; the CSP subsystem is connected to the thermal storage subsystem through the valve and pump; the thermal power regeneration subsystem is connected to the thermal storage subsystem through valve and pump; the control subsystem connects to the battery subsystem and the CSP subsystem,
   wherein, the hybrid solar thermal and photovoltaic panel based cogeneration subsystem generates electricity, which is conducted to the battery subsystem for storage, and thermal energy, which is transferred to the heat pump subsystem to raise temperature; the heat cogenerated by the subsystem and upgraded by the heat pump subsystem is transferred to the thermal storage subsystem for storage; the stored thermal energy in the thermal storage subsystem is further upgraded by the non-tracking non-imaging solar concentrator based CSP subsystem; then the stored thermal energy in the thermal storage subsystem is extracted by the thermal regeneration subsystem to regenerate electricity; wherein, the cogeneration subsystem cogenerated electricity can be directly supply to outside and supplemented by the power regeneration subsystem to realize the stabilized power generation with coordination from a control system.

2. The hybrid solar thermal and photovoltaic panel based cogeneration system and heat pump and non-tracking non-imaging solar concentrator based CSP stabilized power generation system of claim 1, wherein, the non-tracking non-imaging solar concentrator comprises a CPC concentrator with a domed transparent cover and a domed divergent Fresnel lens on the top of the domed transparent cover, as well as a thermal receiver.

3. The hybrid solar thermal and photovoltaic panel based cogeneration system and heat pump and non-tracking non-imaging solar concentrator based CSP stabilized power generation system of claim 1, wherein, the thermal engines can be steam engine, sterling engine, ORC engine, or combination thereof.

4. The hybrid solar thermal and photovoltaic panel based cogeneration system and heat pump and non-tracking non-imaging solar concentrator based CSP stabilized power generation system of claim 1, wherein, the control system is included into the system to coordinate the power output of the hybrid solar thermal and photovoltaic panel based cogeneration subsystem and the power output of the non-tracking non-imaging solar concentrator based CSP subsystem to realize stabilized power generation.

* * * * *